(12) United States Patent
Lu et al.

(10) Patent No.: US 7,098,116 B2
(45) Date of Patent: Aug. 29, 2006

(54) SHALLOW TRENCH ISOLATION METHOD FOR REDUCING OXIDE THICKNESS VARIATIONS AT DIFFERENT PATTERN DENSITIES

(75) Inventors: Chih-Cheng Lu, Taipei (TW); Chuan-Ping Hou, Yungkang (TW); Chu-Yun Fu, Taipei (TW); Chang Wen, Hsin-Chu (TW); Jang Syun Ming, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 245 days.

(21) Appl. No.: 10/753,816

(22) Filed: Jan. 8, 2004

(65) Prior Publication Data

US 2005/0153519 A1  Jul. 14, 2005

(51) Int. Cl.
*H01L 21/76* (2006.01)
(52) U.S. Cl. ...................... 438/427; 438/435
(58) Field of Classification Search ............. 438/424, 438/427, 435
See application file for complete search history.

(56) References Cited

U.S. PATENT DOCUMENTS

| | | | |
|---|---|---|---|
| 5,494,857 A | 2/1996 | Cooperman et al. | 437/228 |
| 6,211,040 B1 | 4/2001 | Liu et al. | 438/424 |
| 6,232,043 B1 | 5/2001 | Lin et al. | 430/317 |
| 6,242,322 B1 | 6/2001 | Chen et al. | 438/424 |
| 6,258,692 B1 | 7/2001 | Chu et al. | 438/400 |
| 6,261,957 B1 * | 7/2001 | Jang et al. | 438/692 |
| 6,319,796 B1 | 11/2001 | Laparra et al. | 438/435 |
| 6,573,152 B1 | 6/2003 | Fazio et al. | 438/424 |

* cited by examiner

*Primary Examiner*—Jack Chen
(74) *Attorney, Agent, or Firm*—Haynes and Boone, LLP

(57) ABSTRACT

A method of reducing oxide thickness variations in a STI pattern that includes both a dense trench array and a wide trench is described. A first HDP CVD step with a deposition/sputter (D/S) ratio of 9.5 is used to deposit a dielectric layer with a thickness that is 120 to 130% of the shallow trench depth. An etch back is performed in the same CVD chamber with $NF_3$, $SiF_4$ or $NF_3$ and $SiF_4$ to remove about 40 to 50% of the initial dielectric layer. A second HDP CVD step with a D/S ratio of 16 deposits an additional thickness of dielectric layer to a level that is slightly higher than after the first deposition. The etch back and second deposition form a smoother dielectric layer surface which enables a subsequent planarization step to provide filled STI features with a minimal amount of dishing in wide trenches.

33 Claims, 5 Drawing Sheets

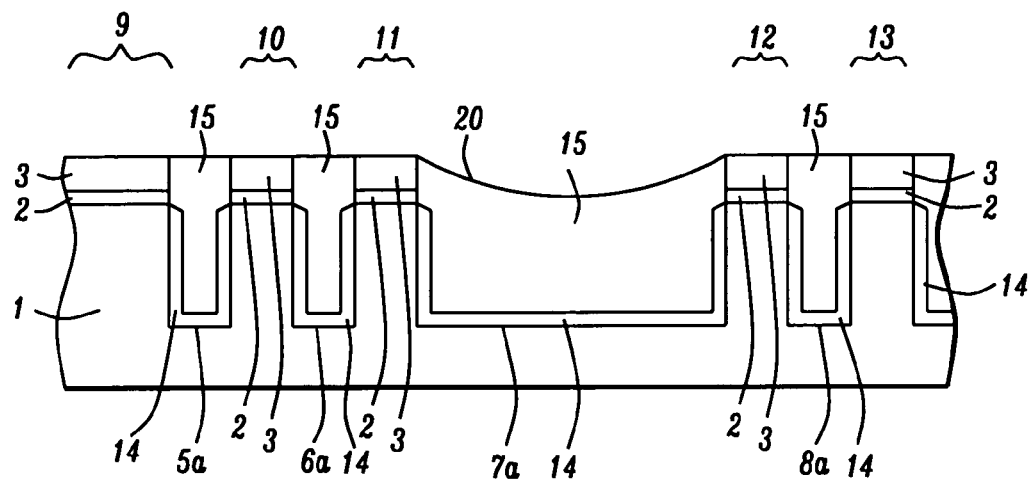
FIG. 3 – Prior Art
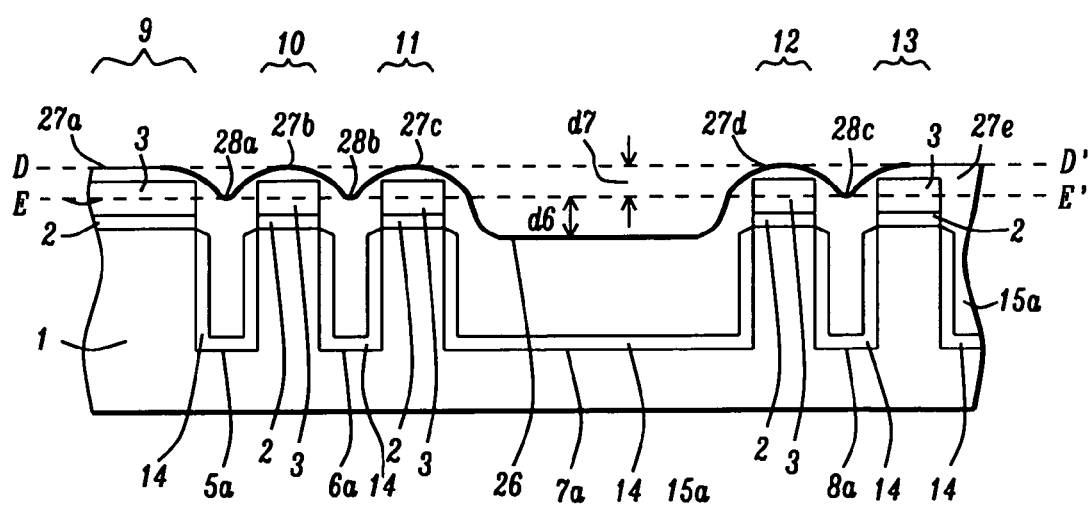
FIG. 4

SHALLOW TRENCH ISOLATION METHOD FOR REDUCING OXIDE THICKNESS VARIATIONS AT DIFFERENT PATTERN DENSITIES

FIELD OF THE INVENTION

The present invention relates to a method of fabricating an integrated circuit device, and in particular, to a method of forming shallow trench isolation (STI) features with a minimum amount of oxide thickness variation.

BACKGROUND OF THE INVENTION

As ground rules continue to shrink for devices in new technologies, device isolation regions called shallow trench isolation (STI) features have become increasingly popular as a means of separating active regions from one another. Devices such as transistors, resistors, and diodes are formed on active regions of a substrate. Increasing circuit density and improving device performance not only require that individual components of a device shrink in size but that the shallow trench isolation features are also reduced in dimension, especially the width or distance between adjacent active regions.

Each pattern that is formed in a substrate is typically first printed in a photoresist layer by a lithographic process involving an exposure followed by developing in an aqueous base solution. Selected portions of the photoresist are removed to expose an underlying layer and the remaining photoresist layer serves as an etch mask while the pattern is transferred into the substrate to form lines and spaces, for example. Typically, the pattern is complex and contains isolated, semi-isolated, and dense features in various arrays. A variation of a line/space pattern is a trench which may have a width that ranges from about 0.1 microns to greater than 10 microns. One version of a trench pattern is a shallow trench that has a depth of approximately 3000 to 4000 Angstroms (0.3–0.4 microns). The width of the active region between shallow trenches may have a similar range of sizes as the trench. Generally, an oxide liner is grown on the sidewalls and bottom of a trench as a means of preventing dopant in adjacent source/drain regions from migrating into the STI features and rounds the adjacent silicon device edge to minimize leakage current.

A necessary result of shallow trench isolation (STI) fabrication is that the insulating material which fills the shallow trench should form a smooth surface after a planarization step. This condition ensures that a subsequent step such as patterning a photoresist to form a template for a gate layer in a transistor device will have an optimum focus and exposure latitude. However, a high density plasma (HDP) chemical vapor deposition (CVD) step that is often used to deposit an oxide insulating layer into a shallow trench is known to form a thicker insulating layer in portions of a shallow trench pattern that have densely packed trenches with small opening widths while forming a thinner insulating layer in wide shallow trenches. A subsequent planarization process involving a chemical mechanical polish (CMP) step cannot compensate for the thickness variation and causes a dishing or bowl shaped indentation in the insulating layer formed within wide shallow trenches. The problem is not easily corrected and expensive rework steps may result. Therefore, an improved STI fabrication method that overcomes oxide thickness variations in a pattern having different opening widths is needed.

In U.S. Pat. No. 5,494,857, a polish assist layer is deposited on an oxide filler layer in an STI scheme. A photoresist is patterned on the polish assist layer and etched to form blocks of the assist layer in large depressions. The assist blocks enable a CMP step to form a planar surface on the oxide fill layer that is independent of pattern density.

An STI method is described in U.S. Pat. No. 6,258,692 in which a buffer layer such as silicon nitride is deposited on a mask layer and in a shallow trench followed by deposition of a $SiO_2$ insulating layer to fill the trench. The $SiO_2$ layer is partially removed by a CMP step and then an etch back removes the buffer layer and $SiO_2$ above the level of the shallow trench to leave a planar surface.

In U.S. Pat. No. 6,319,796, a first dielectric layer is formed over a shallow trench pattern by a HDP CVD method. The HDP CVD method is continued with a different deposition/etch ratio to give a second dielectric layer on the first dielectric layer. The thickness of the combined dielectric layers may be adjusted to minimize thickness variation over trenches with different widths.

An STI method is described in U.S. Pat. No. 6,232,043 that involves partial etching of an HDP CVD layer over an active region before a CMP is performed. The oxide thickness to be removed during CMP is determined by the % of active area and the % of etched area relative to total wafer area. However, the method is not applicable when the width of the active region shrinks to about 0.13 micron or less. A similar STI method is described in U.S. Pat. No. 6,242,322 where a HDP CVD oxide is deposited to fill wide and narrow trenches and a wide island between the trenches. A polysilicon layer is deposited on the HDP CVD oxide followed by a selective CMP step to form a self-align reverse poly mask which exposes only the oxide on the wide island. A large portion of the exposed oxide is removed by a selective etch and then a second CMP step planarizes the oxide layer.

Two step deposition processes are described in U.S. Pat. Nos. 6,573,152 and 6,211,040 in which a first portion of a dielectric layer is deposited in a HDP CVD process with a first etch/deposition (E/D) ratio and a second portion of the dielectric layer is deposited with a second E/D ratio that is higher than the first E/D ratio. However, these prior art methods do not address the issue of different size trenches or trenches with different pattern densities that need to be filled to the same level.

SUMMARY OF THE INVENTION

An objective of the present invention is to provide a method of forming STI features with a different pattern density and with a reduced thickness variation in the dielectric layer that fills the shallow trenches.

Another objective of the present invention is to provide a method of forming STI features that does not decrease throughput or increase cost compared to an existing process.

A still further objective is to provide an STI method that is extendable to sub-0.13 micron technologies.

Yet another objective is to provide a method of forming a dielectric layer with a reduced thickness variation over a metal pattern that has a dense line pattern and a wide trench These objectives are accomplished by providing a substrate having shallow trenches with different pattern densities formed between active regions on a substrate. The pattern is preferably generated by sequentially depositing a pad oxide layer and a silicon nitride layer on the substrate, patterning a photoresist layer on the silicon nitride layer, and etching the pattern through the oxide and nitride layers and into the substrate with a plasma etch process. After the photoresist layer is stripped, a liner oxide layer is grown on the surface of the trench by a rapid thermal oxidation. An anneal process is performed at this point.

A dielectric layer is deposited to fill the shallow trench by a first HDP CVD process to a thickness that is about 120 to 130% of the trench depth. In one embodiment, the dielectric layer is undoped silicon oxide. A thicker dielectric layer is formed over a dense array of narrow shallow trenches and active regions than over a wide trench. The first HDP CVD step has a deposition/sputter ratio that ensures good gap fill with no voids. A plasma etch is performed to remove about 50% of the deposited dielectric layer in the same process chamber as used for the first HDP CVD step. The etch preferably involves a free radical chemical etching with a halogen containing gas such as $NF_3$, $SiF_4$, or a mixture thereof. A physical sputtering etch mechanism by heavy ions is less preferred because of a potential particle problem. The etch removes the thicker regions of the dielectric layer over dense trench arrays at a faster rate because of a higher number of reaction sites in those regions. A second HDP CVD process is employed in the same process chamber to deposit an additional thickness of the dielectric layer before planarization. In the second HDP CVD process, the deposition/sputter ratio is higher than in the first HDP CVD process to afford a higher deposition rate with a lower etch component that further planarizes the etched back dielectric layer.

A rapid thermal annealing step is performed to densify the dielectric layer and then a CMP step is used to planarize the dielectric layer to be coplanar with the nitride masking layer. As a result of the etch back and second HDP CVD steps, the amount of dishing in wide trenches is significantly reduced due to a more planarized topography and less oxide thickness variation at different pattern densities. Conventional steps are followed to remove the silicon nitride and pad oxide layers.

In a second embodiment, a metal pattern having an overlying anti-reflective coating (ARC) is formed on a substrate. A silicon rich oxide (SRO) layer and undoped silicate glass (USG) layer are sequentially formed on the ARC and on the sidewalls and bottoms of the openings in the metal pattern. The metal pattern may be comprised of a dense line array adjacent to a wide opening that has a width at least twice as large as the width of a metal line or opening in the dense array. A first HDP CVD step is used to deposit a dielectric layer such as silicon oxide to a minimum depth that is about 120 to 130% of the combined thickness of the ARC and metal pattern. A thicker dielectric layer is formed over a dense array of ,metal lines than over the wide opening. The first HDP CVD step has a deposition/sputter ratio that ensures good gap fill with no voids in narrow openings. A plasma etch is performed to remove about 50% of the deposited dielectric layer in the same process chamber as used for the first HDP CVD step. The etch preferably involves a free radical chemical etching with a halogen containing gas such as $NF_3$, $SiF_4$, or a mixture thereof. The etch removes the thicker regions of the dielectric layer over the dense metal lines at a faster rate because of a higher number of reaction sites in those regions. A second HDP CVD process is employed in the same process chamber to deposit an additional thickness of the dielectric layer before planarization. In the second HDP CVD process, the deposition/sputter ratio is higher than in the first HDP CVD process to afford a higher deposition rate with a lower etch component that further planarizes the etched back dielectric layer.

BRIEF DESCRIPTION OF THE DRAWINGS

FIG. 3 is a cross-sectional drawing of shallow trench features formed in a substrate after a planarization of the structure shown in FIG. 2 by a prior art method.

FIG. 4 is a cross-sectional drawing after the dielectric layer in FIG. 2 is etched back according to a method of the present invention.

DETAILED DESCRIPTION OF THE INVENTION

Figure 1:
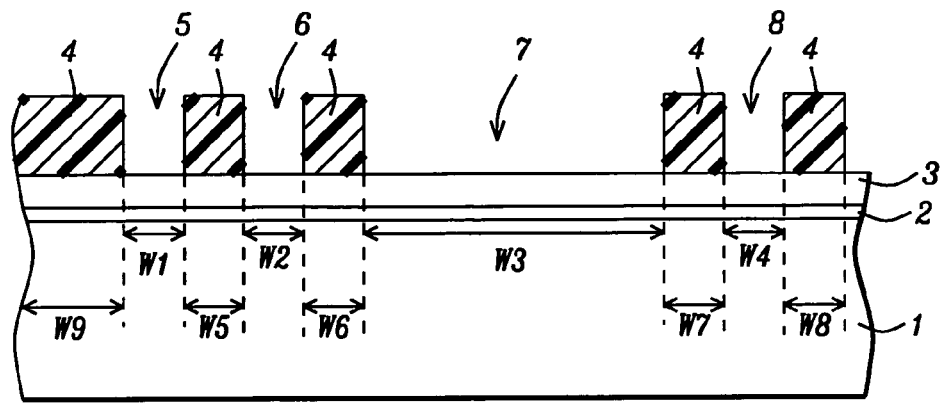
FIG. 1 is a cross-sectional view of a photoresist layer that has been patterned on a substrate.

The present invention relates to a method of forming shallow trench isolation (STI) features with different pattern densities and with a uniform insulating layer thickness. The method is applicable to fabricating any device in which isolation regions are used to separate active regions on a substrate. In a second embodiment, the method may be used to form a uniform dielectric layer over a pattern of metal lines on a substrate. The drawings are for illustration only and are not intended to limit the scope of the invention. The figures are not necessarily drawn to scale and the relative sizes of the various features shown in the drawings may be different than those in an actual device.

The first embodiment of the present invention is depicted in FIGS. 1–2 and 4–7. Referring to FIG. 1, a substrate 1 is shown that is typically monocrystalline silicon but optionally may be based on a silicon-germanium, silicon-on-insulator, or other semiconductor materials used in the art. The substrate 1 generally contains a substructure (not shown) that includes active and passive devices. A pad oxide layer 2 with a thickness of about 50 to 200 Angstroms and preferably about 90 Angstroms is grown on the substrate 1 by an oxidation process that may be a rapid thermal oxidation (RTO), for example. Next, a chemical vapor deposition (CVD) technique or a diffusion thermal process is used to deposit a silicon nitride layer 3 having a thickness from between 600 and 1800 Angstroms and preferably about 800 to 1200 Angstroms on the pad oxide layer 2.

A commercially available photoresist is spin coated and baked on the silicon nitride layer 3 to give a photoresist layer 4 that is subsequently patterned with a conventional lithography process to give openings 5, 6, 7, and 8 that have widths $w_1$, $w_2$, $w_3$, and $w_4$, respectively. The remaining regions of the photoresist layer 4 have widths $w_5$, $w_6$, $w_7$, $w_8$, and $w_9$. It is important to understand that a variety of patterns may be printed in the photoresist layer 4. In one embodiment, all widths $w_1$-$w_9$ may be equal in size. In an embodiment that is more representative of actual device designs, at least one of the openings (herein shown as opening 5) has a width ($w_3$) that is substantially larger than the other widths $w_1$, $w_2$, and $w_4$–$w_8$. The widths $w_1$, $w_2$, and $w_4$–$w_8$ may have a size that is less than 1 micron and for newer devices may be about 0.1 micron or less. The width $w_3$ is at least about two times the size of the largest width of $w_1$, $w_2$, and $w_4$. Optionally, $w_3$ may be more than 10 times the size of $w_1$, $w_2$, and $w_4$ and may be larger than 10 microns. Note that the widths $w_1$–$w_9$ may have different sizes such that no two of the widths $w_1$–$w_9$ are equivalent.

As mentioned previously, a variety of patterns may be printed in the photoresist layer 4 and the method of the present invention is not restricted to any particular pattern. The pattern that presents the biggest challenge to forming a uniform dielectric layer thickness in subsequently fabricated STI features is one which has a dense array of small openings such as openings 5, 6 adjacent to a wide opening 7. A dense array typically involves a plurality of small openings having a similar size formed in a photoresist pattern but the number has been reduced to two in FIG. 1 to simplify the drawing. In the exemplary embodiment, a first dense array is pictured that has a group of small openings 5, 6 and small photoresist regions having widths $w_5$, $w_6$ where the ratio of width $w_1$ or $w_2$ to width $w_5$ or $w_6$ is from about 1:1 to 1:1.5. There is a second dense array that includes the opening 8 and adjacent regions of the photoresist layer 4 having widths $w_7$, $w_8$ where the ratio of width $w_4$ to either width $w_7$ or width $w_8$ is preferably about 1:1 to 1:1.5. Note that a wide opening 7 separates the first dense array from the second dense array. There is a wide region of the photoresist layer 4 having a width $w_9$ of about 1 micron or larger that may separate the first dense array from a third dense array (not pictured). In FIG. 1, the photoresist layer 4 is aligned above portions of the substrate 1 that will become active regions upon which devices such as transistors, resistors, diodes, and the like will be built.

Figure 2:
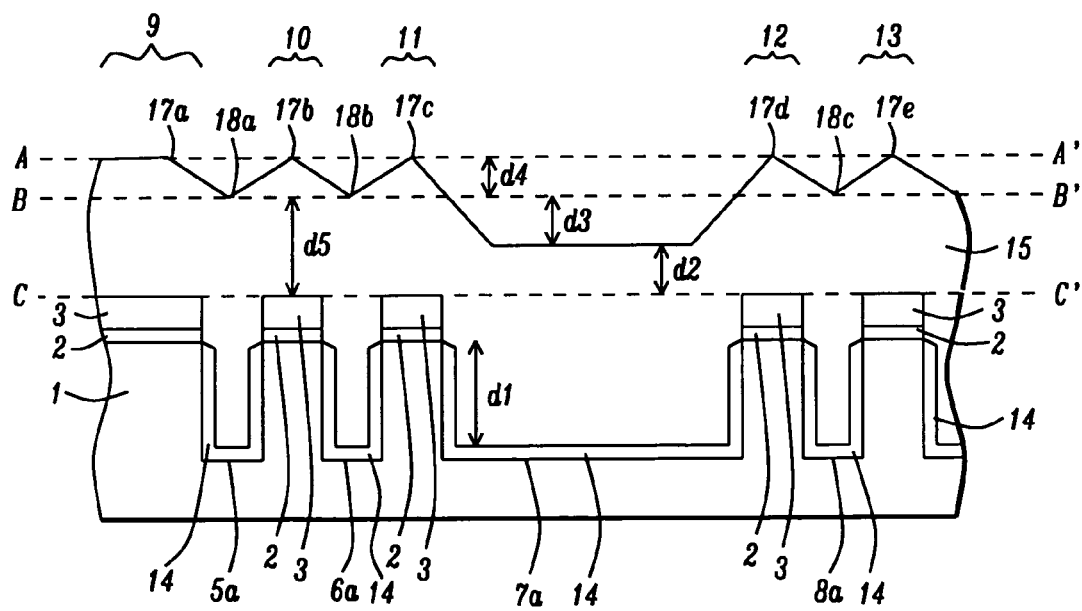
FIG. 2 is cross-sectional view of the shallow trenches formed in the substrate after a plasma etch transfer of the pattern shown in FIG. 1, formation of a liner in the trenches, and deposition of a dielectric layer to fill the trenches.

Referring to FIG. 2, the photoresist pattern is transferred through the silicon nitride layer 3 and pad oxide layer 2 and into the substrate 1 to a depth $d_1$ of about 2500 to 5000 Angstroms and preferably to about 3000 to 4000 Angstroms by a plasma etch sequence known to those skilled in the art. The openings 5, 6, 7, 8 in the photoresist layer 4 become shallow trenches 5a, 6a, 7a, and 8a, respectively, in the substrate 1. Preferably, the pattern transfer process is anisotropic so that the widths $w_1$–$w_4$ in the photoresist layer 4 are maintained in the shallow trenches 5a–8a. The photoresist layer 4 is removed by an oxygen ashing method or by an organic stripper solution after shallow trenches 5a–8a are formed. Although the sidewalls of the shallow trenches are depicted with vertical profiles, the actual profile may vary from vertical to a sloped sidewall in which the top of a shallow trench is wider than the bottom of a shallow trench. The active regions 9, 10, 11, 12, and 13 are formed on the substrate 1 adjacent to the shallow trenches 5a–8a.

A liner oxide layer 14 with a thickness of about 50 to 200 Angstroms is formed on the surface of the substrate 1 within shallow trenches 5a–8a by a thermal oxidation technique. An anneal is performed by heating the substrate 1 in an inert gas or $N_2$ ambient at a temperature of about 800° C. to 1200° C. for a period of about 5 to 10 hours.

In a first key step of the invention, a dielectric layer 15 is deposited on the substrate 1 by a first CVD process in a process chamber that preferably involves a high density plasma (HDP) which provides good gap filling capability in order to fill shallow trench 7a and shallow trenches 5a, 6a, 8a that have small widths $w_1$, $w_2$, and $w_4$, respectively, without forming voids. A first HDP CVD process with a deposition/sputter (D/S) ratio of from 8:1 to 12:1 is employed and preferably with a D/S ratio of about 9.5:1. In one embodiment, the dielectric layer 15 is silicon oxide which is deposited by a process that includes a chamber pressure between about 5 and 20 mTorr, a top RF power of about 3000 to 6000 Watts, a side RF power of about 3000 to 6000 Watts, a bias RF power of from 2000 to 4000 Watts, a side gas flow comprised of $SiH_4$ at a flow rate of about 50 to 100 standard cubic centimeters per minute (sccm) and $O_2$ at a flow rate of about 100 to 200 sccm, and a top gas flow comprised of a $SiH_4$ flow rate of 0 to about 50 sccm and an $O_2$ flow rate of 0 to about 100 sccm. Alternatively, a He gas flow of between 200 and 400 sccm may be added to one or both of the top and side gas flows.

In a preferred embodiment, the dielectric layer 15 is deposited to a thickness that is about 120% to 130% of the combined thickness of pad oxide layer 2, silicon nitride layer 3, and a shallow trench that has a depth $d_1$. Note that a first minimum thickness of the dielectric layer 15 is located over the wide trench 7a and a second minimum thickness is located above dense arrays of shallow trenches that include active regions 10–13. The thickness of the dielectric layer 15 over a wide active region 9 is similar to that over active regions in dense arrays. In one embodiment in which the shallow trench depth $d_1$ is about 4000 Angstroms, pad oxide layer 2 thickness is about 90 Angstroms, and silicon nitride layer 3 thickness is about 800 Angstroms, the first minimum thickness for the dielectric layer 15 is about 1600 Angstroms above the top of the shallow trench 7a.

In the exemplary embodiment depicted in FIG. 2, a first minimum thickness of the dielectric layer 15 is formed above the wide shallow trench 7a and is represented by a section 16 of the top surface. Widths $w_1$, $w_2$, and $w_4$–$w_8$ are near the minimum feature size of about 0.1 microns while the width $w_3$ is between about 1 and 10 microns and the width $w_9$ is about 1 micron or larger. Section 16 is a distance $d_2$ above the top surface of silicon nitride layer 3 that is shown as dashed line C–C'. The distance $d_2$ is typically about 1000 to 2000 Angstroms. A maximum thickness of dielectric layer 15 occurs at section 17a of the top surface and at points 17b, 17c, 17d, and 17e that are located above the active regions 9, 10, 11, 12, and 13, respectively, and which are located on the dashed line A–A'. The second minimum thickness of the dielectric layer 15 over dense arrays that include active regions 10–13 is represented by the dashed line B–B'. Note that points 18a, 18b, and 18c located above shallow trenches 5a, 6a, and 8a, respectively, are at a second minimum thickness $d_6$ above the silicon nitride layer 3 in a dense array. The difference between the second minimum thickness $d_6$ in dense arrays and the first minimum thickness $d_2$ over a wide shallow trench is depicted as a thickness $d_3$ that is also referred to as the overdeposited thickness $d_3$. The difference between the maximum thickness and second minimum thickness above dense arrays is shown as the distance $d_4$.

When the widths $w_1$, $w_2$, and $w_4$–$w_8$ are near the minimum feature size of about 0.1 micron and width $w_3$ is about 1 micron or larger in size, then a maximum value for $d_4$ and $d_3$ result which are approximately 1000 Angstroms and 1400 Angstroms, respectively. If shallow trench widths $w_1$, $w_2$, and $w_4$ are held near a minimum feature size and $w_3$ is maintained at $\geq 1$ micron while widths $w_5$–$w_8$ for active regions are increased, then $d_4$ and $d_3$ remain near their maximum values. However, if widths $w_1$, $w_2$, and $w_4$ are increased simultaneously with widths $w_5$–$w_8$ or if widths $w_1$, $w_2$, and $w_4$ are increased while widths $w_5$–$w_8$ are maintained near the minimum feature size, then values for $d_4$ and $d_3$ decrease. As widths $w_1$, $w_2$, and $w_4$ become closer to width $w_3$, the values for $d_4$ and $d_3$ approach 0. The present invention is especially valuable for minimizing the thickness variations of a dielectric layer formed over a pattern that has dense arrays and wide trenches so that the amount of overdeposited thickness is minimized before a planarization process is attempted.

Referring to FIG. 3, a chemical mechanical polish (CMP) step is performed on the structure shown in FIG. 2 without minimizing the overdeposited thickness $d_3$. The inventors have practiced this method and observe that when the dielectric layer 15 is polished to a level that is coplanar with the top surface of silicon nitride layer 3 a dishing defect 20 occurs in a wide shallow trench 7a. For sub-0.13 micron technology where widths $w_1$, $w_2$ and $w_4$–$w_8$ may be less than 0.13 micron, even a highly selective CMP of dielectric layer 15 cannot prevent a large dishing defect 20 in a wide shallow trench 7a when a large pre-CMP overdeposited thickness $d_3$ exists for the dielectric layer 15.

Referring to FIG. 4, a key feature of the present invention that minimizes dishing defects in a wide shallow trench adjacent to a dense array of shallow trenches is an etch back step following the first HDP CVD process. A plasma etch is preferably performed in the same process chamber in which dielectric layer 15 is deposited. In one embodiment, the etch comprises $NF_3$ gas at a flow rate of from 200 to 500 sccm, a substrate temperature in the range of 400° C. to 600° C., a RF power of 2000 to 6000 Watts, a RF bias power of about 500 to 3000 Watts, and a chamber pressure of about 10 to 30 mTorr for a period of about 10 to 50 seconds. Under these conditions, about 40% to 50% of the original dielectric layer 15 thickness is removed over the wide shallow trench 7a. For example, when $d_1$=4000 Angstroms, $d_2$=1600 Angstroms, and the silicon nitride 3 and pad oxide 2 layers have a thickness of 800 Angstroms and 90 Angstroms, respectively, then about a 2500 to 3500 Angstroms thickness of the dielectric layer 15 is removed above the wide shallow trench 7a. The free radical chemistry in the plasma etch is believed to attack the higher portions of the dielectric layer 15 over the dense arrays at a faster rate than over the wide shallow trench 7a since there are more reactive sites on the surface of the dielectric layer above the dense arrays than over the wide shallow trench 7a. Preferably, the etch back step does not uncover the liner oxide layer 14 so that damage to the liner oxide layer is avoided.

Optionally, another halogen containing gas such as $SiF_4$ or a combination of $SiF_4$ and $NF_3$ may be used in place of $NF_3$ for the etch back step. In an alternative embodiment, an inert gas such as He or Ar may be added to one or both of a side gas flow and a top gas flow of $NF_3$, $SiF_4$ or a mixture of $SiF_4$ and $NF_3$.

As a result of the etch back step, the thinned dielectric layer 15a has a maximum thickness over the dense arrays which is represented by the dashed line D–D' and includes section 27a and points 27b, 27c, 27d, and 27e on the surface of the dielectric layer. The second minimum thickness of dielectric layer 15a over the dense arrays of shallow trenches is represented by the dashed line E–E' and includes points 28a, 28b, and 28c on the surface of the dielectric layer which are located about midway over the shallow trenches 5a, 6a, 8a, respectively. The difference between the maximum thickness and second minimum thickness over the dense arrays is $d_7$ which is smaller than $d_4$. The first minimum thickness of dielectric layer 15a above the wide shallow trench 7a is at the section 26 on the surface of the dielectric layer which is a distance $d_6$ below the second minimum thickness above dense arrays. The inventors have discovered that the overdeposited thickness $d_3$ after the first deposition of the dielectric layer 15 may be reduced by about 50% to a thickness $d_6$ in the thinned dielectric layer 15a. Note that the highest points 27b, 27c, 27d, 27e on the surface of dielectric layer 15a are on more rounded profiles than the peaks which include the high points 17b–17e in FIG. 2.

Figure 5:
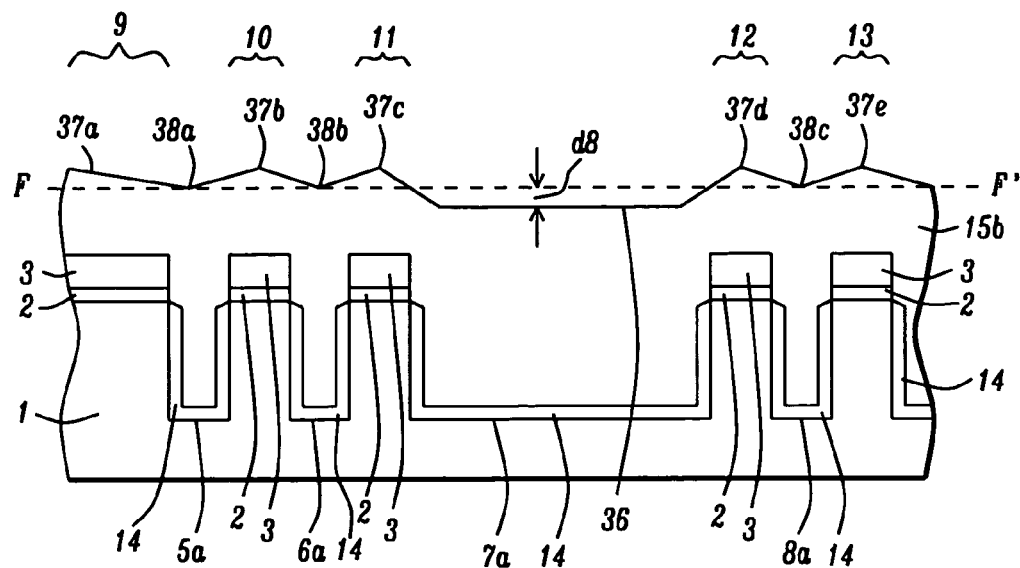
FIG. 5 is a cross-sectional drawing that shows a second deposition of the dielectric layer on the structure shown in FIG. 4 according to a method of the present invention.

Referring to FIG. 5, another key feature of the present invention is a second HDP CVD process following the etch back step. The second HDP CVD process is preferably carried out in the same chamber as the first HDP CVD process and the etch back step in order to have an optimum throughput for the STI fabrication. The second HDP CVD process adds an additional thickness of the dielectric material that formed dielectric layer 15 on the thinned dielectric layer 15a to afford a composite dielectric layer 15b which includes thinned dielectric layer 15a and the dielectric layer from the second deposition. In the second HDP CVD process, about 3000 Angstroms of a dielectric layer containing the same dielectric material as in the first HDP CVD process is added to thinned dielectric layer 15a. In other words, the resulting dielectric layer 15b has a thickness that is at least as large as the thickness of the dielectric layer 15 after the first HDP CVD deposition and is preferably thicker than the thickness of dielectric layer 15.

Furthermore, the second HDP CVD process is carried out with a higher deposition rate than in the first HDP CVD process since a higher sputter rate that is sufficient to ensure good gap fill is not needed. The D/S ratio is from about 10:1 to 20:1 and is preferably in the range of 14:1 to 16:1 to further reduce the difference in thickness between the second minimum thickness of dielectric layer 15b above the dense arrays and the first minimum thickness over the wide shallow trench 7a.

In the embodiment where the dielectric layer 15b is silicon oxide, the second HDP CVD process includes a chamber pressure between about 5 and 20 mTorr, a top RF power of about 3000 to 6000 Watts, a side RF power of about 3000 to 6000 Watts, a RF bias power of about 2000 to 4000 Watts, a side gas flow comprised of $SiH_4$ at a flow rate of about 50 to 150 sccm and $O_2$ at a flow rate of about 100 to 300 sccm, and a top gas flow comprised of a $SiH_4$ flow rate of 0 to about 100 sccm and an $O_2$ flow rate of 0 to about 200 sccm. Alternatively, a He gas flow of between 200 and 400 sccm may be added to one or both of the top and side gas flows.

The maximum thickness of the dielectric layer 15b over the dense arrays including the active regions 10, 11, 12, 13 is at section 37a and points 37b, 37c, 37d, 37e on the surface of the dielectric layer. The second minimum thickness of the dielectric layer 15b over the dense arrays is represented by the dashed line F–F' that includes the points 38a, 38b, 38c over the shallow trenches 5a, 6a, 8a, respectively. A first minimum thickness of the dielectric layer 15b over the wide shallow trench 7a is at section 36 on the surface of the dielectric layer. The distance between the second minimum thickness over the dense arrays and the first minimum thickness over the wide shallow trench 7a which is also referred to as the overdeposited thickness $d_8$ is significantly smaller than the overdeposited thickness $d_3$ after the first HDP deposition. In the example described previously with regard to FIG. 2, a $d_3$ of about 1400 Angstroms after the first HDP deposition may be reduced to a $d_8$ of approximately 700 Angstroms after the etch back step and second HDP deposition of the present invention. Thus, a thickness variation improvement of at least 50% may be realized in the dielectric layer that fills the shallow trenches 5a, 6a, 7a, 8a. For other embodiments where widths $w_1$, $w_2$, and $w_4$ are increased above a minimum size of about 100 nm, then $d_3$ and $d_8$ may be less than 1400 and 700 Angstroms, respectively, but a significant decrease in overdeposited thickness from $d_3$ to $d_8$ will still be achieved.

Those skilled in the art will appreciate that a second etch back step similar to the first etch back step and a third HDP deposition similar to the second HDP deposition may be performed if a further reduction in the overdeposited thickness of the dielectric layer above the shallow trenches is desired in order to meet product requirements.

A rapid thermal anneal (RTA) process is now performed by subjecting the substrate to a temperature between about 800° C. and 1200° C. in an inert gas or $N_2$ ambient for a period of about 10 to 60 seconds.

Figure 6:
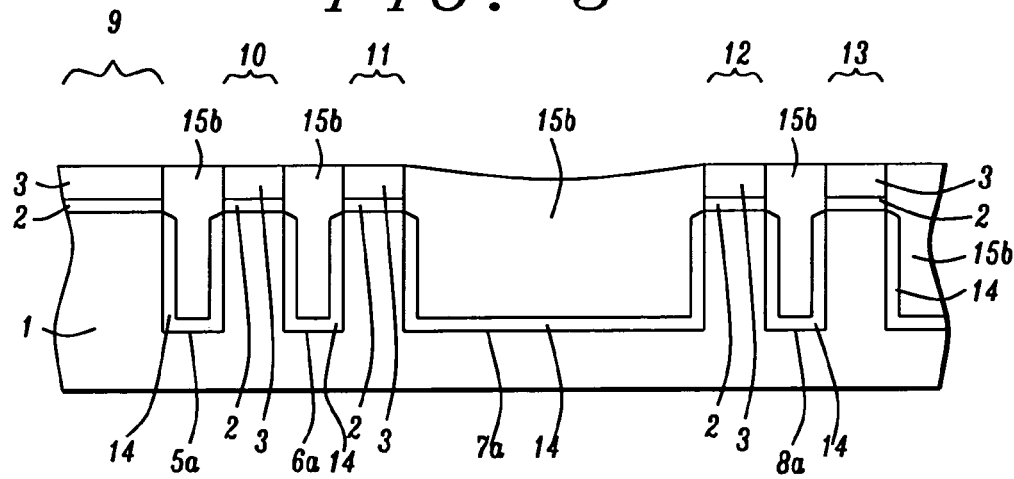
FIG. 6 is a cross-sectional drawing of the structure in FIG. 5 after a planarization step according to a method of the present invention.

Referring to FIG. 6, the STI fabrication method is continued by a planarization process such as an oxide CMP step, for example, which thins the dielectric layer 15b so that it becomes coplanar with the silicon nitride layer 3 in dense arrays that include the shallow trenches 5a, 6a, 8a. Because of the reduced thickness variations in the deposited dielectric layer 15b compared to the thickness variations in the dielectric layer 15 after only one HDP CVD step, the CMP step is able to form a wide shallow trench 7a with a substantially more planar surface than the prior art.

Figure 7:
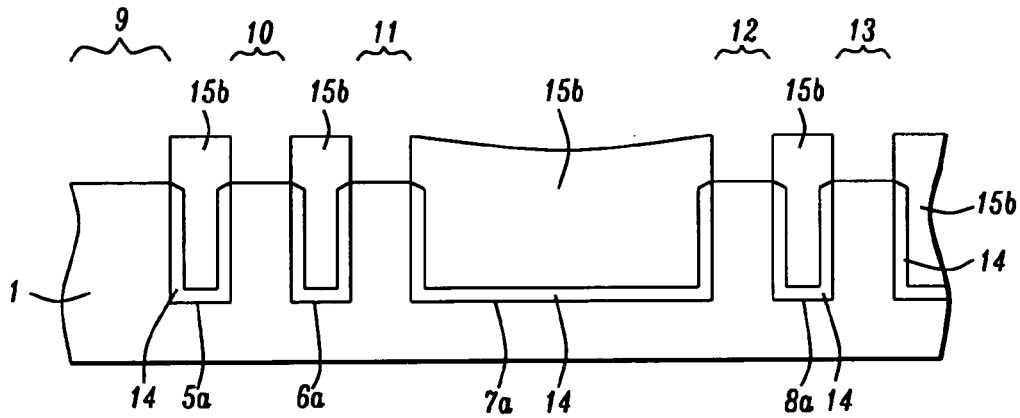
FIG. 7 is a cross-sectional view that shows completed shallow trench isolation features after adjacent masking layers are removed from the structure in FIG. 6.

Referring to FIG. 7, the silicon nitride layer 3 is typically removed by a wet etch that involves hot $H_3PO_4$. Next, the pad oxide layer 2 may be removed by a wet etch that includes a dilute HF solution. Subsequently, processes known to those skilled in the art may be performed to construct transistors, resistors, diodes and the like on the active regions 9–13.

One benefit of the present invention is that a reduction in thickness variation of a dielectric layer over a shallow trench pattern including a dense array and a wide trench is achieved without any detrimental effects on device performance. Moreover, there is a minimal impact on throughput since the etch back step and second HDP CVD process are performed in the same process chamber as the first HDP CVD process which allows a single process flow to be inputted into the process tool to control the three step sequence. Any extra time required for the etch back and second HDP CVD step is more than offset by enhanced device performance and a reduced amount of rework because of fewer dishing defects which is a cost savings. Additionally, the CMP step is performed at lower cost because less consumables are needed when the pre-CMP thickness variation of the dielectric layer is reduced relative to conventional methods.

A second embodiment of the present invention is depicted in FIGS. 8–11 in which the HDP CVD deposition and etch back method described previously is employed in the fabrication of a more uniform oxide layer over a metal pattern.

Figure 8:
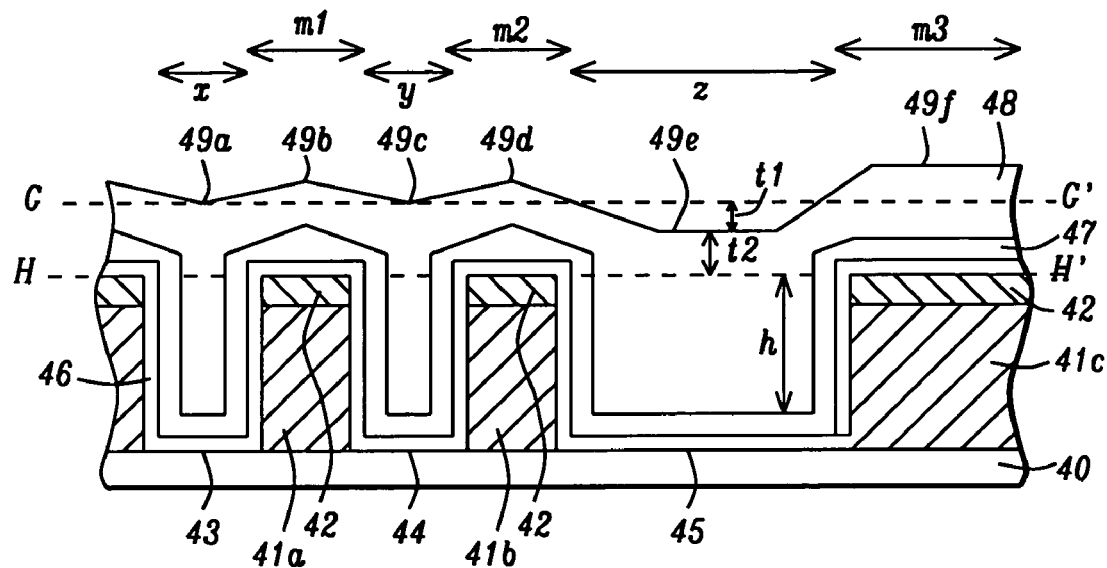
FIGS. 8–11 depict a second embodiment of the present invention in which a planar dielectric layer is formed over a metal pattern by a process that includes a first HDP CVD step, an etch back step, a second HDP CVD step, and a planarization.

Referring to FIG. 8, a substrate 40 is provided that is typically silicon but may be based on silicon-germanium, silicon-on-insulator (SOI), or other semiconductor materials used in the art. The substrate 40 may comprise active and passive devices that are not shown. A metal pattern that includes the lines 41a, 41b, 41c and an overlying anti-reflective layer 42 is formed on substrate 40 by a well known method that is not described herein. The metal lines 41a, 41b, 41c having widths $m_1$, $m_2$, and $m_3$, respectively, may be comprised of aluminum, Al/Cu alloy, or tungsten and have a thickness of about 3000 to 10000 Angstroms. A trench 43 having a width x and a trench 44 having a width y are formed on opposite sides of the metal line 41a and a trench 45 having a width z is formed between the metal lines 41b and 41c.

In one embodiment, the widths $m_1$, $m_2$, $m_3$, x, y, z are equivalent. In an embodiment that is more representative of typical device patterns, at least one of the trenches (herein shown as trench 45) has a width z that is substantially larger than the widths $m_1$, $m_2$, $m_3$, x, y. The metal lines 41a, 41b and trenches 43, 44 may be part of a dense line array comprised of a plurality of metal lines and the size of z is at least twice the size of the other widths $m_1$, $m_2$, $m_3$, x, y. In some metal line patterns, z may be more than 10 times the size of the other widths $m_1$, $m_2$, $m_3$, x, y. It is understood by those skilled in the art that forming a planar oxide layer over a metal line pattern is most challenging when there is at least one wide trench adjacent to a dense array of lines in the pattern.

The ARC layer 42 is preferably comprised of TiN with a thickness from about 200 to 1000 Angstroms and is used to control reflectivity during the patterning process to form the metal lines 41a, 41b, 41c. Alternatively, the ARC layer 42 may be comprised of TaN, TiW, TaSiN, Ti, or silicon oxynitride (SiON). The combined thickness of a metal line 41a, 41b, or 41c and the overlying ARC layer 42 is shown as the thickness h. Next, a PECVD method is used to deposit a silicon rich oxide (SRO) liner 46 having a thickness between 100 and 1200 Angstroms and preferably about 300 Angstroms. An undoped silicate glass (USG) layer 47 is deposited on the SRO liner 46 by a HDP CVD process that preferably forms a conformal USG layer with nearly vertical sidewalls that does not block the openings of the trenches 43, 44.

In a first key step of the invention, a dielectric layer 48 is deposited on the USG layer 47 by a first CVD process in a process chamber that preferably involves a high density plasma (HDP) which provides good gap filling capability in order to fill the wide trench 45 and the narrower trenches 43, 44 without forming voids. A first HDP CVD process with a deposition/sputter (D/S) ratio of from 8:1 to 12:1 is employed and preferably with a D/S ratio of about 9.5:1. In one embodiment, the dielectric layer 48 is silicon oxide which is deposited by a process that includes a top RF power of about 3000 to 6000 Watts, a side RF power of about 3000 to 6000 Watts, a bias RF power of from 2000 to 4000 Watts, a side gas flow comprised of $SiH_4$ at a flow rate of about 50 to 100 standard cubic centimeters per minute (sccm) and $O_2$ at a flow rate of about 100 to 200 sccm, and a top gas flow comprised of a $SiH_4$ flow rate of 0 to about 50 sccm and an $O_2$ flow rate of 0 to about 100 sccm. Alternatively, a He gas flow of between 200 and 400 sccm may be added to one or both of the top and side gas flows. The invention also anticipates that a doped silicon oxide such as fluorine doped silicon oxide may be employed as the dielectric layer 48.

In a preferred embodiment, the dielectric layer 48 is deposited to a thickness that is about 120% to 130% of the thickness h. Note that a larger thickness of the dielectric layer 48 is formed above the dense array of narrow trenches that include trenches 43, 44 while a first minimum thickness is formed over the wide trench 45. A first minimum thickness of the dielectric layer 48 is located above the wide trench 45 along a section 49e of the top surface. The section 49 is a distance $t_2$ above the top surface of the ARC layer 42 that is shown as dashed line H–H'. The distance $t_2$ is typically about 1000 to 2000 Angstroms. A maximum thickness of dielectric layer 48 occurs along the flat section 49f of the top surface and at points 49b, 49d that are located above the metal lines 41a, 41b, respectively. A second minimum thickness of dielectric layer 48 is located over the dense array that includes the metal lines 43, 44 and is represented by the dashed line G–G'. Note that points 49a, 49c located on the line G–G' are above the trenches 43, 44, respectively, and have a thickness $t_1$ above the section 49e. The thickness $t_1$ is also referred to as the overdeposited thickness $t_1$.

If a CMP process is performed at this point to planarize the dielectric layer 48, an indentation or dishing defect would remain on the surface of the dielectric layer 48 over the wide trench 45 because of the large thickness variation represented by the overdeposited thickness $t_1$ which may be 1000 Angstroms or more. Even if a second HDP CVD process is performed to deposit an additional thickness of the dielectric layer 48 and reduce the magnitude of $t_1$ somewhat, a subsequent CMP process is still likely to leave a large dishing defect on the surface of the polished layer. The inventors have found that the amount of dishing is minimized to an acceptable level following a planarization process only when an etch back step according to the present invention is sandwiched between two HDP CVD steps when forming the dielectric layer.

Figure 9:
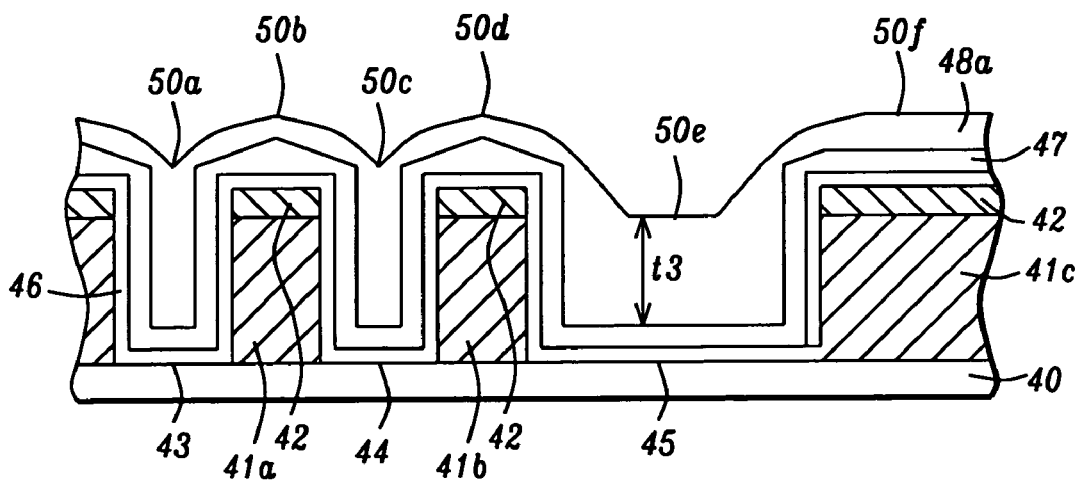

Referring to FIG. 9, the etch back step is a plasma etch which is preferably performed in the same process chamber in which the dielectric layer 48 is deposited. In one embodiment, the etch back step comprises $NF_3$ gas at a flow rate of from 200 to 500 sccm, a substrate temperature in the range of 400° C. to 600° C., a RF power of 2000 to 6000 Watts, a RF bias power of about 500 to 3000 Watts, and a chamber pressure of about 10 to 30 mTorr for a period of about 10 to 50 seconds. Under these conditions, about 40% to 50% of the original dielectric layer 48 thickness is removed over the wide trench 45. The free radical chemistry in the plasma etch is believed to attack the higher portions of the dielectric layer 48 over the dense array at a faster rate than over the wide trench 45 since there are more reactive sites on the surface of the dielectric layer above the dense array than over the wide trench 45. Preferably, the etch back step does not uncover the USG layer 47 so that damage to the USG layer is avoided.

Optionally, another halogen containing gas such as $SiF_4$ or a combination of $SiF_4$ and $NF_3$ may be used in place of $NF_3$ for the etch back step. In an alternative embodiment, an inert gas such as He or Ar may be added to $NF_3$, $SiF_4$ or a mixture of $SiF_4$ and $NF_3$.

As a result of the etch back step, the thinned dielectric layer 48a has a maximum thickness over the dense array at points 50b, 50d and over the metal line 41c along section 50f. The second minimum thickness of the dielectric layer 48a over the dense array of trenches is at points 50a, 50c which are located about midway over the trenches 43, 44, respectively. The first minimum thickness of the dielectric layer 48a above the wide trench 45 is at the section 50e on the surface of the dielectric layer which is a distance $t_3$ above the USG layer 47. Note that the highest points 50b, 50d on the surface of dielectric layer 48a are on more rounded profiles than the peaks which include the high points 49b, 49d in FIG. 8.

Figure 10:
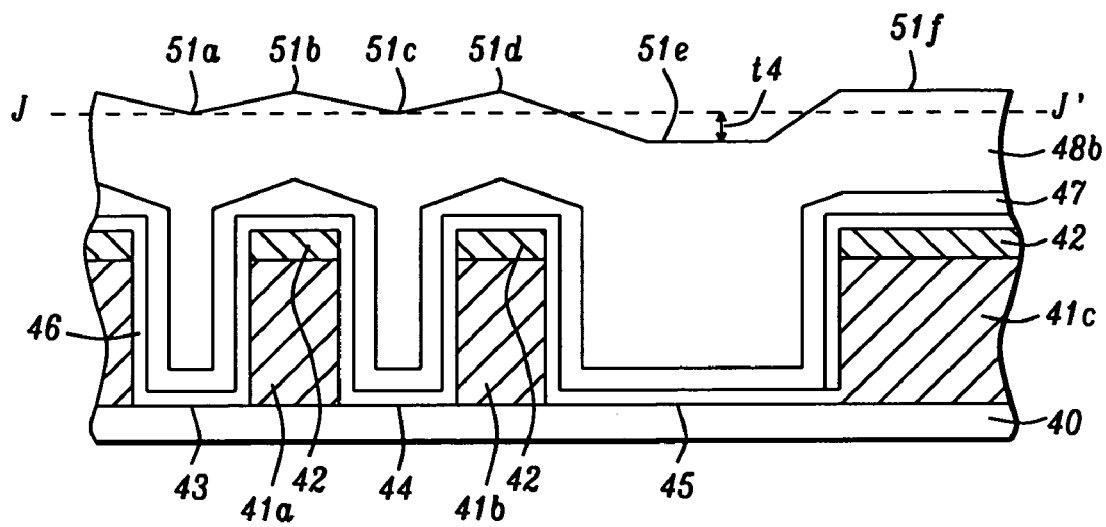

Referring to FIG. 10, another key feature of the present invention is a second HDP CVD process following the etch back step. The second HDP CVD process is preferably carried out in the same chamber as the first HDP CVD process and the etch back step in order to have an optimum throughput for the STI fabrication. The second HDP CVD process adds an additional thickness of the dielectric material that formed dielectric layer 48 on the thinned dielectric layer 48a to afford a composite dielectric layer 48b which includes the thinned dielectric layer 48a and the dielectric layer from the second HDP CVD process. In the second HDP CVD process, the resulting dielectric layer 48b has a thickness that is at least as large as the thickness of the dielectric layer 48 after the first HDP CVD deposition and is preferably thicker than the thickness of the dielectric layer 48.

Furthermore, the second HDP CVD process is carried out with a higher deposition rate than in the first HDP CVD process since a higher sputter rate that is sufficient to ensure good gap fill is not needed. The D/S ratio is from about 10:1 to 20:1 and is preferably in the range of 14:1 to 16:1 to further reduce the difference in thickness between the second minimum thickness of dielectric layer 48b above the dense array and the first minimum thickness over the wide trench 45.

In the embodiment where the dielectric layer 48b is silicon oxide, the second HDP CVD process includes a top RF power of about 3000 to 6000 Watts, a side RF power of about 3000 to 6000 Watts, a RF bias power of about 2000 to 4000 Watts, a side gas flow comprised of $SiH_4$ at a flow rate of about 50 to 150 sccm and $O_2$ at a flow rate of about 100 to 300 sccm, and a top gas flow comprised of a $SiH_4$ flow rate of 0 to about 100 sccm and an $O_2$ flow rate of 0 to about 200 sccm. Alternatively, a He gas flow of between 200 and 400 sccm may be added to one or both of the top and side gas flows.

The maximum thickness of the dielectric layer 48b over the dense array including the trenches 43, 44 is at point 51b, 51d on the surface of the dielectric layer. The second minimum thickness of the dielectric layer 48b over the dense array is represented by the dashed line J–J' that includes the points 51a, 51c over the trenches 43, 44, respectively. A first minimum thickness of the dielectric layer 48b over the wide trench 45 is along the section 51e on the surface of the dielectric layer. The distance between the second minimum thickness over the dense array and the first minimum thickness over the wide trench 45 which is also referred to as the overdeposited thickness $t_4$ is significantly smaller than the overdeposited thickness $t_1$ after the first HDP deposition. In fact, a thickness variation improvement of at least 50% is achieved. For other embodiments where width z is less than two times the size of the widths $m_1$, $m_2$, $m_3$, x, y, z, then the overdeposited thickness reduction after the second HDP CVD process may be less than $(t_1-t_4)$ but is still significantly larger than if no etch back process is performed between the two HDP CVD steps.

Figure 11:
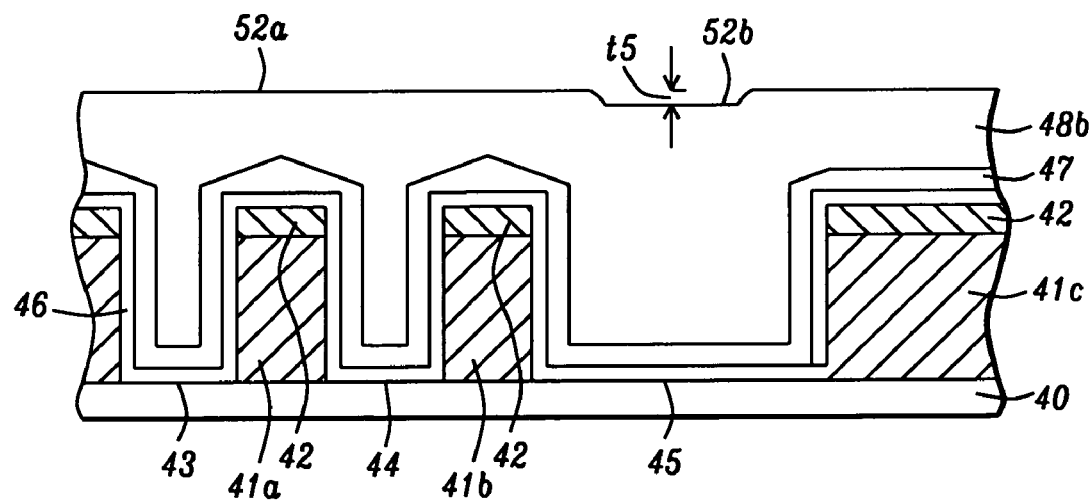

Referring to FIG. 11, a rapid thermal anneal (RTA) process may now be performed according to a method known to those skilled in the art. A planarization process such as an oxide CMP step, for example, is employed which thins the dielectric layer 48b and further smoothes the top surface. Because of the reduced thickness variations in the deposited dielectric layer 48b compared with the thickness variations in the dielectric layer 48 after only one HDP CVD step, the CMP step is able to form a substantially more planar surface than the prior art. For example, the amount of dishing $t_5$ along a section 52b of the top surface 52a is smaller than previously achieved. Furthermore, fewer consumables are needed during the CMP step which reduces cost. Another benefit is that a more planar dielectric layer is achieved over a large area of the substrate which enables a subsequent patterning process that defines a second metal pattern above the first metal pattern to be accomplished with a wider process latitude.

While this invention has been particularly shown and described with reference to, the preferred embodiments thereof, it will be understood by those skilled in the art that various changes in form and details may be made without departing from the spirit and scope of this invention.

We claim:

1. A method of filling a pattern of openings in a substrate with a dielectric layer, comprising:
   providing a substrate having a pattern formed therein, said pattern is comprised of a dense array of openings that have widths smaller than a first width and a wide opening that has a second width that is larger than said first width and wherein the openings have a depth;
   performing a first high density plasma (HDP) chemical vapor deposition (CVD) step in a process chamber that deposits a dielectric layer with a first minimum thickness above said wide opening and a second minimum thickness above said dense array;
   etching back said dielectric layer in said process chamber with a halogen containing gas to give a thinned dielectric layer; and
   performing a second HDP CVD step in said process chamber to deposit an additional thickness of said dielectric layer and form a composite dielectric layer which includes the thinned dielectric layer and the dielectric layer of the second HDP CVD step that fills said openings.

2. The method of claim 1 wherein said openings are shallow trenches that are formed in said substrate to a depth of about 2500 to 5000 Angstroms.

3. The method of claim 2 wherein said dense array includes a plurality of shallow trenches that have a width smaller than said first width and wherein adjacent shallow trenches are separated from each other by an active region that has a width smaller than said first width.

4. The method of claim 2 wherein said first width is about 1 micron and said second width is at least two times the width of a largest opening in said dense array.

5. The method of claim 1 wherein said dielectric layer is comprised of silicon oxide and the first HDP CVD process includes a chamber pressure between about 5 and 20 mTorr, a top RF power of about 3000 to 6000 Watts, a side RF power of about 3000 to 6000 Watts, a bias RF power of from 2000 to 4000 Watts, a side gas flow comprised of SiH4 at a flow rate of about 50 to 100 standard cubic centimeters per minute (sccm) and O2 at a flow rate of about 100 to 200 sccm, and a top gas flow comprised of a SiH4 flow rate of 0 to about 50 sccm and an O2 flow rate of 0 to about 100 sccm.

6. The method of claim 1 wherein said dielectric layer is comprised of silicon oxide and the second HDP CVD process includes a chamber pressure between about 5 and 20 mTorr, a top RF power of about 3000 to 6000 Watts, a side RF power of about 3000 to 6000 Watts, a RF bias power of about 2000 to 4000 Watts, a side gas flow comprised of SiH4 at a flow rate of about 50 to 150 sccm and O2 at a flow rate of about 100 to 300 sccm, and a top gas flow comprised of a SiH4 flow rate of 0 to about 100 sccm and an O2 flow rate of 0 to about 200 sccm.

7. The method of claim 1 wherein said first HDP CVD step has a deposition/sputter ratio from about 8:1 to 12:1 and the second HDP CVD step has a deposition/sputter ratio from about 10:1 to 20:1.

8. The method of claim 1 wherein one or both of the first HDP CVD step and second HDP CVD step are further comprised of one or both of a side He flow rate of about 200 to 400 sccm and a top He flow rate of about 200 to 400 sccm.

9. The method of claim 1 wherein the first minimum thickness of said dielectric layer is about 120% to 130% of the depth of said openings.

10. The method of claim 1 wherein said second minimum thickness is greater than said first minimum thickness.

11. The method of claim 1 wherein the etching back step comprises a NF3 gas flow rate of about 200 to 500 sccm, a substrate temperature in the range of 400° C. to 600° C., a RF power of about 2000 to 6000 Watts, a RF bias power of about 500 to 3000 Watts, and a chamber pressure of about 10 to 30 mTorr for a period of about 10 to 50 seconds.

12. The method of claim 1 wherein the halogen containing gas is NF3, SiF4, or a mixture of NF3 and SiF4.

13. The method of claim 1 wherein the etching back step thins the dielectric layer by about 40% to 50% of its original thickness.

14. The method of claim 1 wherein the second HDP CVD step forms a composite dielectric layer with a thickness that is at least as large as the thickness of the dielectric layer after the first HDP CVD step.

15. The method of claim 1 further comprised of annealing said composite dielectric layer by heating at about 800° C. to 1200° C. in an inert gas or N2 ambient for a period of about 10 to 60 seconds.

16. A method of forming shallow trench isolation features in a substrate, comprising:
   providing a substrate upon which a pad oxide layer and a silicon nitride layer have been sequentially formed;
   forming a pattern of shallow trenches in said silicon nitride layer that extend through said pad oxide layer and into said substrate, said pattern is comprised of a dense array of shallow trenches that have widths smaller than a first width and a wide shallow trench that has a second width which is larger than said first width and wherein the shallow trenches have a depth, sidewalls, and a bottom;
   forming a liner oxide layer on the sidewalls and bottom of said shallow trenches and annealing said substrate;
   performing a first HDP CVD step in a process chamber that forms a dielectric layer with a first minimum thickness above said wide shallow trench and a second minimum thickness above said dense array;
   etching back said dielectric layer in said process chamber with a halogen containing gas to give a thinned dielectric layer;
   performing a second HDP CVD step in said process chamber to deposit an additional thickness of said dielectric layer and form a composite dielectric layer which includes the thinned dielectric layer and the dielectric layer of the second HDP CVD step that fills said shallow trenches;
   performing a rapid thermal annealing of said substrate; and
   planarizing said composite dielectric layer to be coplanar with said silicon nitride layer.

17. The method of claim 16 further comprised of removing the silicon nitride layer after said planarizing step with a wet etch comprising H3PO4.

18. The method of claim 16 wherein the thickness of said pad oxide layer is from about 50 to 200 Angstroms.

19. The method of claim 16 wherein said silicon nitride layer has a thickness of about 600 to 1800 Angstroms.

20. The method of claim 16 wherein the depth of said shallow trenches is between about 2500 and 5000 Angstroms.

21. The method of claim 16 wherein said first width is about 1 micron and said second width is at least two times the width of a largest shallow trench in said dense array.

22. The method of claim 16 wherein said liner oxide layer is grown by a thermal oxidation process and has a thickness from about 50 to 200 Angstroms.

23. The method of claim 16 wherein said dielectric layer is comprised of silicon oxide and the first HDP CVD process includes a chamber pressure between about 5 and 20 mTorr, a top RF power of about 3000 to 6000 Watts, a side RF power of about 3000 to 6000 Watts, a bias RF power of from 2000 to 4000 Watts, a side gas flow comprised of SiH4 at a flow rate of about 50 to 100 sccm and O2 at a flow rate of about 100 to 200 sccm, and a top gas flow comprised of a $SiH_4$ flow rate of 0 to about 50 sccm and an O2 flow rate of 0 to about 100 sccm.

24. The method of claim 16 wherein said dielectric layer is comprised of silicon oxide and the second HDP CVD process includes a chamber pressure between about 5 and 20 mTorr, a top RF power of about 3000 to 6000 Watts, a side RF power of about 3000 to 6000 Watts, a RF bias power of about 2000 to 4000 Watts, a side gas flow comprised of SiH4 at a flow rate of about 50 to 150 sccm and $O_2$ at a flow rate of about 100 to 300 sccm, and a top gas flow comprised of a $SiH_4$ flow rate of 0 to about 100 sccm and an O2 flow rate of 0 to about 200 sccm.

25. The method of claim 16 wherein the first HDP CVD step has a deposition/sputter ratio from about 8:1 to 12:1 and the second HDP CVD step has a deposition/sputter ratio of about 10:1 to 20:1.

26. The method of claim 16 wherein one or both of the first HDP CVD step and second HDP CVD step are further comprised of one or both of a side He flow rate of about 200 to 400 sccm and a top He flow rate of about 200 to 400 sccm.

27. The method of claim 16 wherein the first minimum thickness of said dielectric layer is about 120 to 130% of the depth of said shallow trenches.

28. The method of claim 16 wherein the second minimum thickness is greater than said first minimum thickness.

29. The method of claim 16 wherein the etching back step comprises a NF3 flow rate of from 200 to 500 sccm, a RF power between about 2000 and 6000 watts, a RF bias power of about 500 to 3000 Watts, a chamber pressure of about 10 to 30 mTorr, and a chamber temperature from about 400° C. to 600° C.

30. The method of claim 16 wherein the halogen containing gas is NF3, SiF4, or a mixture of NF3 and SiF4.

31. The method of claim 16 wherein the etching back step thins the dielectric layer by about 40% to 50% of its original thickness.

32. The method of claim 16 wherein the rapid thermal anneal is comprised of heating the substrate at about 800° C. to 1200° C. in an inert gas or N2 ambient for a period of about 10 to 60 seconds.

33. The method of claim 16 wherein the planarizing step is a chemical mechanical polish process.

* * * * *